(12) United States Patent
Chung et al.

(10) Patent No.: US 7,734,967 B2
(45) Date of Patent: Jun. 8, 2010

(54) SEMICONDUCTOR MEMORY DEVICE AND TESTING METHOD OF THE SAME

(75) Inventors: Hoe-ju Chung, Yongin-si (KR); Yun-sang Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 284 days.

(21) Appl. No.: 11/863,500

(22) Filed: Sep. 28, 2007

(65) Prior Publication Data
US 2008/0082871 A1 Apr. 3, 2008

(30) Foreign Application Priority Data
Sep. 28, 2006 (KR) .................. 10-2006-0095055

(51) Int. Cl.
*G11C 29/00* (2006.01)
(52) U.S. Cl. .................. 714/719; 714/5; 714/30; 714/42; 714/718; 714/720; 714/721; 714/731; 714/736; 714/744; 714/745; 365/201
(58) Field of Classification Search .................. None
See application file for complete search history.

(56) References Cited

U.S. PATENT DOCUMENTS

| | | | | |
|---|---|---|---|---|
| 5,910,181 A * | 6/1999 | Hatakenaka et al. | ........ | 714/718 |
| 5,933,379 A * | 8/1999 | Park et al. | .................. | 365/201 |
| 6,862,704 B1 * | 3/2005 | Miner | .................. | 714/718 |
| 6,934,900 B1 * | 8/2005 | Cheng et al. | ................ | 714/738 |
| RE38,956 E * | 1/2006 | Beffa et al. | ................. | 365/201 |
| 7,269,772 B1 * | 9/2007 | Li et al. | ................. | 714/733 |
| 7,349,515 B1 * | 3/2008 | Chew et al. | ................ | 375/376 |
| 7,551,499 B2 * | 6/2009 | Lee | .................. | 365/201 |
| 2001/0013110 A1 * | 8/2001 | Pierce et al. | ................ | 714/718 |
| 2005/0146981 A1 * | 7/2005 | Ahn | .................. | 365/233 |
| 2005/0162949 A1 * | 7/2005 | Lindstedt et al. | .......... | 365/201 |
| 2005/0185484 A1 * | 8/2005 | Jang et al. | .................. | 365/201 |
| 2007/0046309 A1 * | 3/2007 | LaBerge | .................. | 324/765 |
| 2007/0226567 A1 * | 9/2007 | Gorman et al. | ........... | 714/733 |

FOREIGN PATENT DOCUMENTS

| | | | |
|---|---|---|---|
| JP | 2001-291400 | | 10/2001 |
| JP | 02001291400 A | * | 10/2001 |
| KR | 1020020048258 A | | 6/2002 |
| KR | 10-2004-0004568 | | 1/2004 |
| KR | 10-2006-0019543 | | 3/2006 |
| KR | 1020060038026 A | | 5/2006 |
| WO | 02/080184 A2 | | 10/2002 |
| WO | 2004/105040 A2 | | 12/2004 |

\* cited by examiner

*Primary Examiner*—John P Trimmings
(74) *Attorney, Agent, or Firm*—Volentine & Whitt, P.L.L.C.

(57) ABSTRACT

A semiconductor memory device, having a test mode and a normal mode, includes a frequency multiplier and a test command sequence generator. The frequency multiplier receives a test clock signal in the test mode and generates multiple internal test clock signals, each of which has a frequency equal to a frequency of an operation clock signal in the normal mode. The test clock signal has a frequency lower than the frequency of the operation clock signal. The test command sequence generator generates at least one command signal in response to the internal test clock signals in the test mode. The at least one command signal corresponds to at least one operation timing parameter of the semiconductor memory device that is to be measured. The frequency multiplier may include a Phase Locked Loop (PLL) or a Delay Locked Loop (DLL).

12 Claims, 4 Drawing Sheets

SEMICONDUCTOR MEMORY DEVICE AND TESTING METHOD OF THE SAME

CROSS-REFERENCE TO RELATED PATENT APPLICATION

A claim of priority is made to Korean Patent Application No. 10-2006-0095055, filed on Sep. 28, 2006, the subject matter of which is hereby incorporated by reference.

BACKGROUND OF THE INVENTION

1. Field of the Invention

The present invention relates to a semiconductor memory device, and more particularly, to a testing method for the semiconductor memory device.

2. Description of the Related Art

Conventionally, semiconductor memory devices are tested at a wafer level after being manufactured. When memory cells are identified as being of poor quality from the wafer level test, the memory cells are repaired. Then, the semiconductor memory devices pass through a packaging process to be tested at the package level, and semiconductor memory devices of good quality are the end product.

During the package level test, an interface distance for communication between the semiconductor testing equipment and the semiconductor memory device being tested is short. A high-frequency operation test is therefore possible. However, this is not the case during the wafer level test and thus a high-frequency clock signal for a high-frequency operation test is not properly provided. In addition, due to limitations of the testing equipment for the wafer level test, a high-frequency test cannot be performed at an actual operation frequency of the semiconductor memory device.

Therefore, from among various operation timing parameters of a semiconductor memory device, the wafer level test is performed only for limited parameters. Due to these limitations, defects may not be found in the wafer level test, and there is a possibility that defects not found in the wafer level test may also not be found during the package level test.

SUMMARY OF THE INVENTION

According to an aspect of the present invention, there is provided a semiconductor memory device having a test mode and a normal mode. The semiconductor memory device includes a frequency multiplier that receives a test clock signal in the test mode and that generates multiple internal test clock signals, each of which has a frequency equal to a frequency of an operation clock signal in the normal mode. The test clock signal has a frequency lower than the frequency of the operation clock signal. The semiconductor memory device also includes a test command sequence generator that generates at least one command signal in response to the internal test clock signals in the test mode. The at least one command signal corresponds to at least one operation timing parameter of the semiconductor memory device that is to be measured. The frequency multiplier may include a Phase Locked Loop (PLL) or a Delay Locked Loop (DLL).

The semiconductor memory device may further include a test pattern register, a memory core, a comparator and an output buffer. The test pattern register receives and stores a test pattern input to the semiconductor memory device in the test mode. The memory core receives and stores the test pattern from the test pattern register and responds to the at least one command signal generated by the test command sequence generator. The comparator compares the test pattern with a data pattern read from the memory core. The output buffer receives the comparison from the comparator and outputs the comparison from the semiconductor device.

The frequency multiplier may further include a phase frequency detector, a charge pump, a loop filter, a voltage controlled oscillator, a programmable variable delay and a divider. The phase frequency detector detects phase and frequency differences of the test clock signal and a feedback clock signal. The charge pump receives an output signal from the phase frequency detector and outputs a charge pump signal. The loop filter low pass filters the charge pump signal from the charge pump. The voltage controlled oscillator generates a reference internal test clock signal in response to the filtered charge pump signal of the loop filter. The programmable variable delay delays the reference internal test clock signal and outputs a first internal test clock signal and a second internal test clock signal of the multiple internal test clock signals. The divider divides the first internal test clock signal and generates the feedback clock signal. A delay time of the programmable variable delay may be variable according to programming of the programmable variable delay.

The test command sequence generator may include a first logic circuit and a second logic circuit. The first logic circuit generates a first command signal of the at least one command signal, for controlling an initial point of a first corresponding operation timing parameter to be measured, in response to the first internal test clock signal. The second logic circuit generates a second command signal of the at least one command signal, for controlling an end point of the first operation timing parameter and an initial point of a second corresponding operation timing parameter to be measured, in response to the second internal test clock signal.

According to another aspect of the present invention, there is provided a wafer level test method for a semiconductor memory device, having a test mode and a normal mode. The method includes applying a test clock signal having a frequency in the test mode lower than a frequency of an operation clock signal in the normal mode; generating multiple internal test clock signals, each internal test clock signal having a frequency equal to the frequency of the operation clock signal; generating command signals corresponding to operation timing parameters of the semiconductor memory device that are to be measured in response to the internal test clock signals; and operating a memory core using the generated command signals and storing a test pattern in the memory core. A data pattern read from the memory core is compared with the test pattern. The operation timing parameters of the semiconductor memory device are measured based on the comparison of the data pattern read and the test pattern. The internal test clock signals may be generated by a frequency multiplier having a PLL or a DLL.

Generating the internal test clock signals may include detecting phase and frequency differences of the test clock signal and a feedback clock signal, outputting a charge pump signal in response to the detected phase and frequency differences, low pass filtering the charge pump signal, and generating a reference internal test clock signal in response to the filtered signal. The reference internal test clock signal is delayed to output the internal test clock signals. A first internal test clock signal of the internal test clock signals is divided to generate the feedback clock signal.

Generating of the command signals may include responding to the first internal test clock signal in order to generate a first command signal which controls an initial point of a first operation timing parameter that is to be measured, and responding to the second internal test clock signal in order to generate a second command signal which controls an end point of the first operation timing parameter and an initial point of a second operation timing parameter that is to be measured.

BRIEF DESCRIPTION OF THE DRAWINGS

The embodiments of the present invention will be described with reference to the attached drawings, in which.

DETAILED DESCRIPTION OF THE EMBODIMENTS

Figure 1:
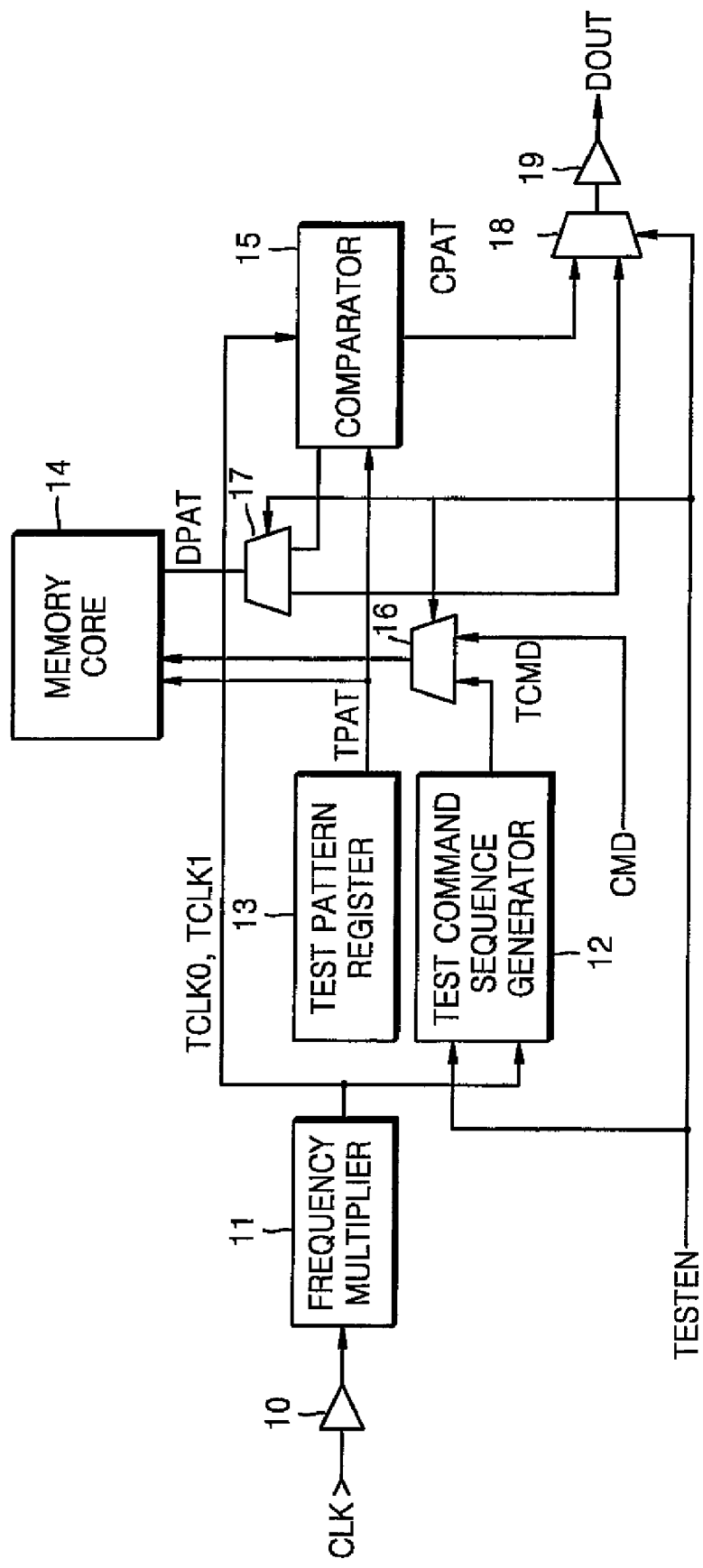
FIG. 1 is a schematic block diagram of a semiconductor memory device, according to an embodiment of the present invention.

The present invention will be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Embodiments of the present invention provide a semiconductor memory device that can be tested using an actual operation frequency and to accurately measure operation timing parameters of the semiconductor memory device at the wafer level. The embodiments also provide a method of performing a test with an actual operation frequency and measuring operation timing parameters more accurately at the wafer level.

FIG. 1 is a schematic block diagram of a semiconductor memory device according to an illustrative embodiment of the present invention. Referring to FIG. 1, the semiconductor memory device according to the depicted embodiment includes a clock input buffer 10, a frequency multiplier 11, a test command sequence generator 12, a test pattern register 13, a memory core 14, a comparator 15, a multiplexer 16, a demultiplexer 17, a multiplexer 18, and an output buffer 19.

The clock input buffer 10 receives a clock (CLK) signal input from outside of the semiconductor memory device. In a normal mode of the semiconductor memory device, an operation clock signal is input as the CLK signal. In a test mode of the semiconductor memory device, a test clock signal generated by the testing equipment is input as the CLK signal.

In the depicted embodiment, the test clock signal input as the CKL signal during the wafer level test has a lower frequency than that of the operation clock signal in the normal mode, e.g., due to limitations of the testing equipment. Therefore, the frequency multiplier 11 and the test command sequence generator 12 are needed for the semiconductor memory device to be tested at an actual operation clock frequency at the wafer level. The semiconductor memory device according to the depicted embodiment invention will be described focusing on the test mode.

In the test mode, the clock input buffer 10 receives the input test CLK signal, generated by the testing equipment, to buffer and output the test CLK signal. The test CLK signal has a lower frequency than that of the operation clock signal in the normal mode. The frequency multiplier 11 receives the test CLK signal through the clock input buffer 10 and generates multiple internal test clock signals, e.g., first internal test clock signal TCLK0 and second internal test clock signal TCLK1, each of which has a frequency that is the same as the operation clock signal frequency. The frequency multiplier 11 is described below in more detail with reference to FIG. 2.

The test command sequence generator 12 is enabled in response to activation of a test mode enable (TESTEN) signal in the test mode. The test command sequence generator 12 generates test command (TCMD) signals in response to the first and second internal test clock signals TCLK0 and TCLK1. The TCMD signals correspond to the operation timing parameters and/or operating AC parameters of the semiconductor memory device which are to be measured. When the semiconductor memory device is a synchronous dynamic random access memory (DRAM), for example, the operation timing parameters to be measured may include a row cycle time (tRC), a row active time (tRAS), a row precharge time (tRP), a row active to row active delay (tRRD), and a /RAS to /CAS delay (tRCD). The test command sequence generator 12 is described below in more detail with reference to FIG. 3.

The multiplexer 16 responds to an activation of the TESTEN signal in the test mode and outputs the TCMD signals generated by the test command sequence generator 12 to the memory core 14. In the normal mode, the multiplexer 16 responds to a deactivation of the TESTEN signal and outputs command (CMD) signals input from outside of the semiconductor memory device to the memory core 14.

The test pattern register 13 receives and stores a test (TPAT) pattern input to the semiconductor memory device in the test mode, and provides the stored TPAT pattern to the memory core 14. Therefore, in the test mode, the memory core 14 responds to the TCMD signals generated by the test command sequence generator 12 that is to be operated and receives the TPAT pattern that is to be stored.

In the test mode, the demultiplexer 17 responds to an activation of the TESTEN signal and outputs a data (DPAT) pattern read from the memory core 14 to the comparator 15. In the normal mode, the demultiplexer 17 responds to a deactivation of the TESTEN signal and outputs the DPAT pattern read from the memory core 14 to the multiplexer 18.

The comparator 15 compares the DPAT pattern with the TPAT pattern input through the demultiplexer 17 and outputs the comparison result (CPAT). In an embodiment, the comparator 15 receives the TPAT pattern directly from the test pattern register 13. The multiplexer 18 responds to an activation of the TESTEN signal in the test mode and outputs the CPAT result received from the comparator 15 to the output buffer 19. In addition, in the normal mode, the multiplexer 18 responds to a deactivation of the TESTEN signal and outputs the DPAT pattern read from the memory core 14 to the output buffer 19.

In other words, in the test mode, the DPAT pattern read from the memory core 14 and the TPAT pattern are compared by the comparator 15, and the comparison CPAT result is output from the semiconductor memory device through the output buffer 19. The CPAT result is analyzed by the testing equipment. A determination of whether the semiconductor memory device is defective is made according to the analyzed CPAT result.

As described above, in the semiconductor memory device according to an illustrative embodiment of the present invention, the frequency multiplier 11 generates the first and second internal test clock signals TCLK0 and TCLK1, each of which has a frequency that is the same as a frequency of the operation clock signal in the test mode. The test command sequence generator 12 responds to the first and second internal test clock signals TCLK0 and TCLK1 to generate the TCMD signals, which correspond to the operation timing parameter which is to be measured. The TCMD signals therefore have a frequency that is the same as the frequency of the operation clock signal in the normal mode and are provided to the memory core 14.

Therefore, the memory core 14 in the test mode operates in response to the TCMD signals, which have the same frequency as the operation clock signal in the normal mode. As a result, during the wafer level test, the semiconductor memory device can be tested with an actual operation frequency, that is, the frequency of the operation clock signal in the normal mode.

Figure 2:
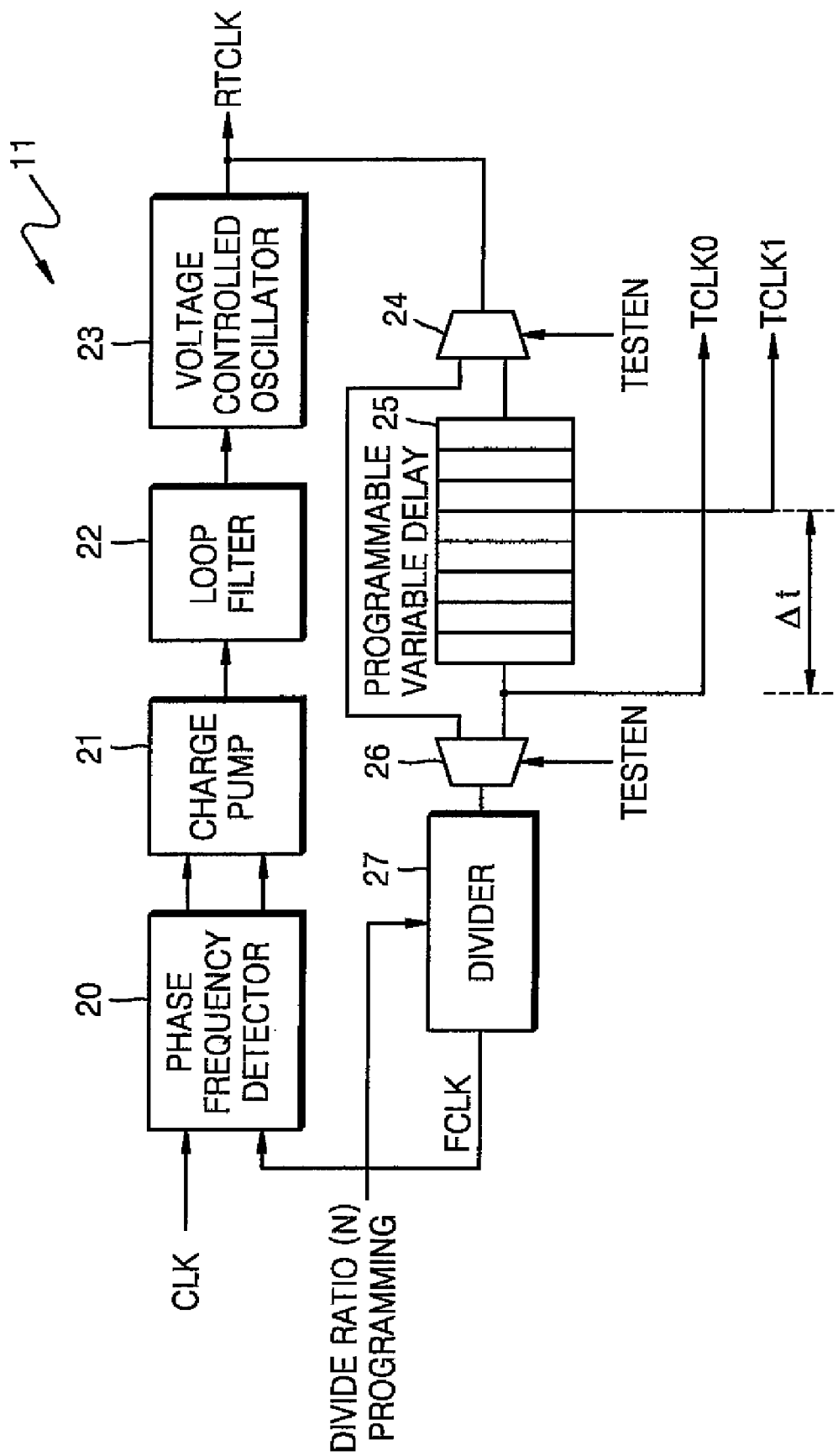
FIG. 2 is a schematic block diagram of a frequency multiplier included in the semiconductor memory device of FIG. 1, according to an embodiment of the present invention.

FIG. 2 is a schematic block diagram of the frequency multiplier 11 included in the semiconductor memory device of FIG. 1, according to an illustrative embodiment of the present invention. The frequency multiplier 11 may be embodied as a Phase Locked Loop (PLL) or a Delay Locked Loop (DLL), for example. In the illustrative embodiment depicted in FIG. 2, the frequency multiplier 11 is embodied as the PLL.

Referring to FIG. 2, the frequency multiplier 11 includes a phase frequency detector 20, a charge pump 21, a loop filter 22, a voltage controlled oscillator 23, a demultiplexer 24, a programmable variable delay 25, a multiplexer 26, and a divider 27.

The phase frequency detector 20 detects phase and frequency differences between the test CLK signal and a feedback clock (FCLK) signal. The charge pump 21 responds to an output signal of the phase frequency detector 20 to output a charge pump signal. A filter, such as loop filter 22, filters the output signal of the charge pump 21. In an embodiment, the loop filter 22 is a low pass filter. The voltage controlled oscillator 23 responds to the output signal of the loop filter 22 and generates a reference internal test clock (RTCLK) signal.

The demultiplexer 24 responds to an activation of the TESTEN signal in the test mode and outputs the RTCLK signal to the programmable variable delay 25. In the normal mode, the demultiplexer 24 responds to a deactivation of the TESTEN signal and outputs the RTCLK signal to the multiplexer 26.

The programmable variable delay 25 delays the RTCLK signal input through the demultiplexer 24 and outputs the first and second internal test clock signals TCLK0 and TCLK1. The delay time of the programmable variable delay 25 may vary according to programming of the programmable variable delay 25.

The multiplexer 26 responds to an activation of the TESTEN signal in the test mode and outputs the first internal test clock signal TCLK0 received from the programmable variable delay 25 to the divider 27. In the normal mode, the multiplexer 26 responds to a deactivation of TESTEN signal and outputs the RTCLK signal received through the demultiplexer 24 to the divider 27. Therefore, in the test mode, the divider 27 divides the first internal test clock signal TCLK0 and generates the FCLK signal. The dividing ratio N of the divider 27 may be controlled, for example, by programming of the divider 27.

Therefore, in the semiconductor memory device according to an embodiment of the present invention, the dividing ratio N of the divider 27 is controlled during the wafer level test. The divider 27 thus receives the test CLK signal, having a lower frequency than that of the operation clock signal in the normal mode, and generates the first and second internal test clock signals TCLK0 and TCLK1, each of which has a frequency that is the same as the frequency of the operation clock signal.

Accordingly, the semiconductor memory device can be tested at the wafer level using an actual operation frequency, that is, the frequency of the operation clock signal in the normal mode. In addition, the time difference ($\Delta t$) between the first internal test clock signal TCLK0 and the second internal test clock signal TCLK1 is controlled. Therefore, the operation timing parameter or the operating AC parameter that is to be measured is controlled, so that the operation timing parameter or the operating AC parameter may be measured more accurately at the wafer level.

In an alternative embodiment, in order to obtain a more accurate time difference ($\Delta t$) between the first internal test clock signal TCLK0 and the second internal test clock signal TCLK1, a phase interpolator may be used instead of the programmable variable delay 25.

Figure 3:
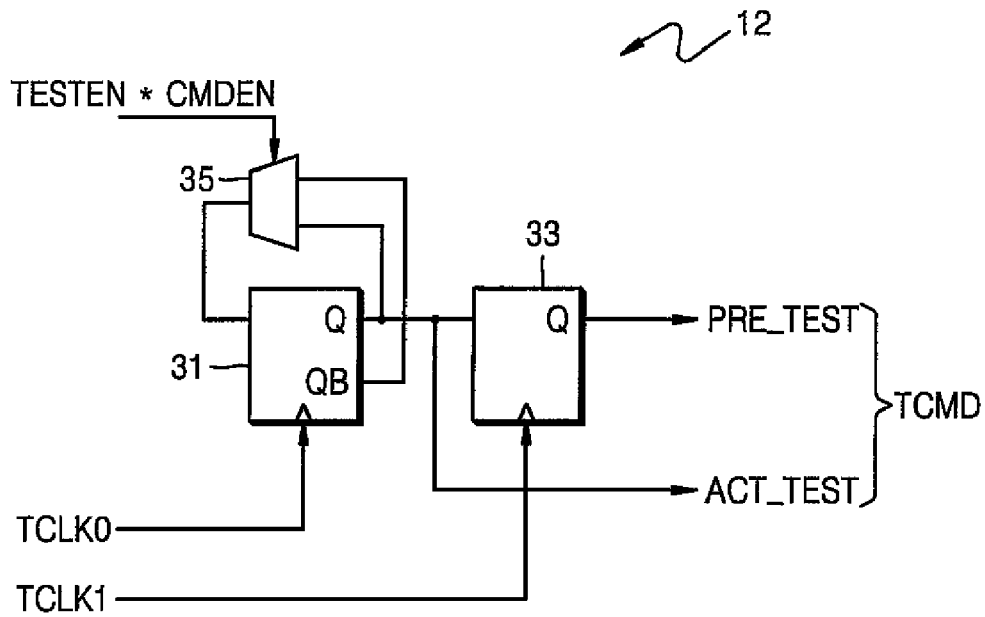
FIG. 3 is a schematic block diagram of a test command sequence generator included in the semiconductor memory device of FIG. 1, according to an embodiment of the present invention.

FIG. 3 is a schematic block diagram of the test command sequence generator 12 included in the semiconductor memory device of FIG. 1, according to an illustrative embodiment of the present invention. In this example, the TCMD signals include a first command signal (ACT_TEST) and a second command signal (PRE_TEST), which control the tRC (row cycle time), and the tRAS (row active time) and the tRP (row precharge time), from among the operating timing parameters or the operating AC parameters that are generated.

Referring to FIG. 3, the test command sequence generator 12 includes a first logic circuit 31, a second logic circuit 33, and a control circuit 35. The first logic circuit 31 responds to the first internal test clock signal TCLK0 and generates the ACT_TEST signal, which controls an initial point of the tRAS. The second logic circuit 33 responds to the second internal test clock signal TCLK1 and generates the PRE_TEST, which controls an initial point of the tRP. The control circuit 35 controls the first logic circuit 31, which is to be operated when the TESTEN signal and a command enable signal (CMDEN) are activated.

Figure 4:
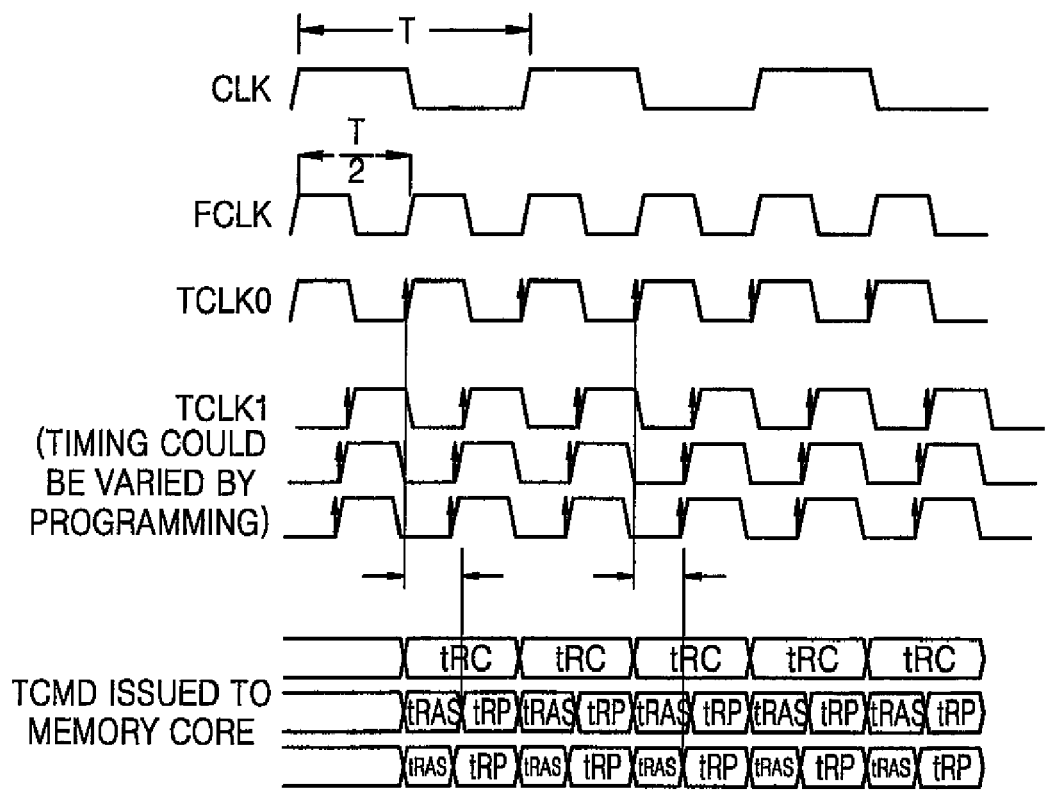
FIG. 4 is a timing diagram of the operation signals of the frequency multiplier of FIG. 2 and the test command sequence generator of FIG. 3, according to an embodiment of the present invention.
Figure 5:
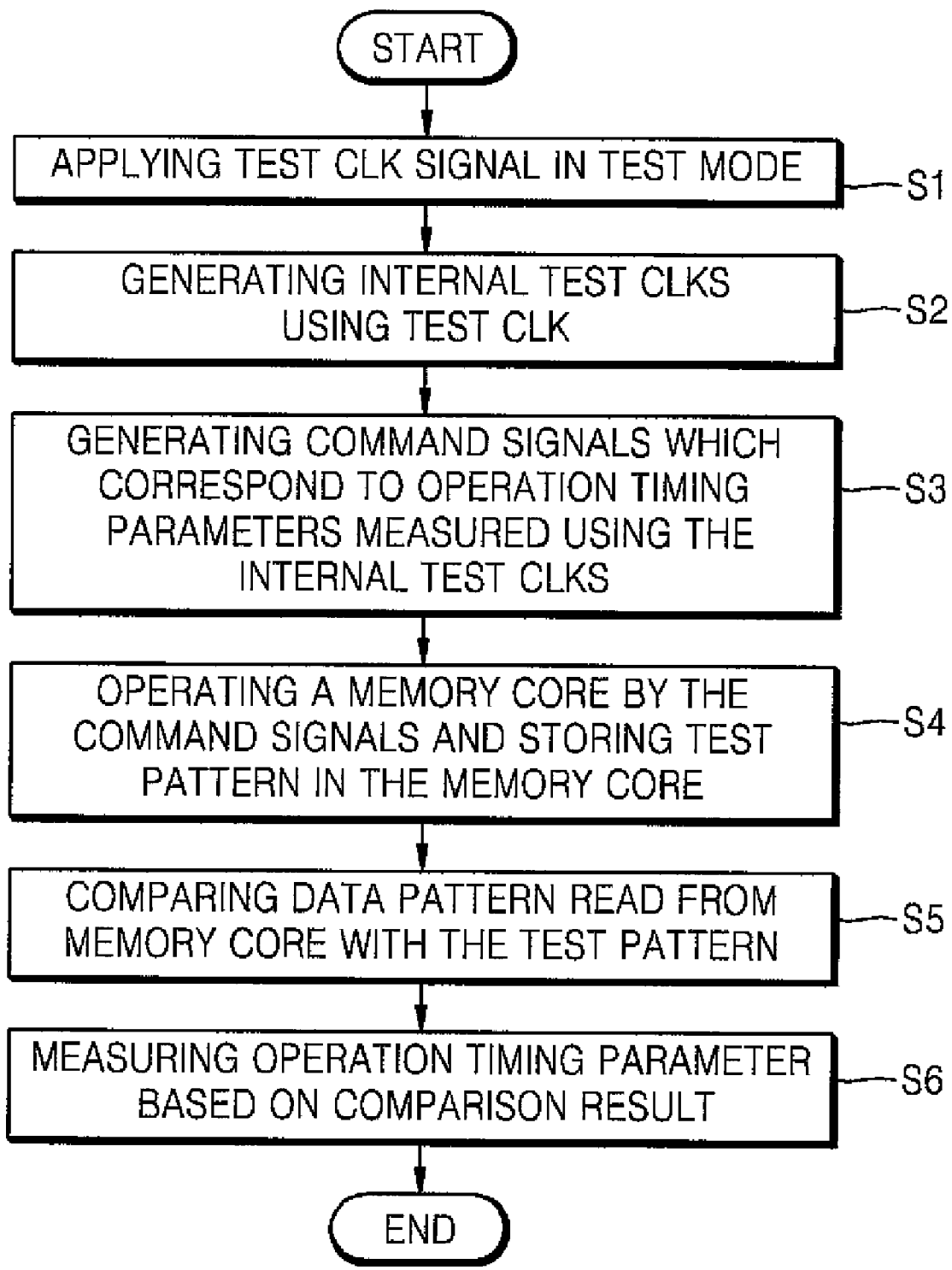
FIG. 5 is a flowchart of a wafer level test method for a semiconductor memory device, according to an embodiment of the present invention.

FIG. 4 is a timing diagram of the operation signals of the frequency multiplier 11 of FIG. 2 and the test command sequence generator 12 of FIG. 3, according to an illustrative embodiment of the present invention. FIG. 5 is a flowchart of a wafer level test method for the semiconductor memory device according to an illustrative embodiment of the present invention. The wafer level test method for the semiconductor memory device according to an illustrative embodiment of the present invention is described below with reference to FIGS. 4 and 5.

First, the test CLK signal is generated by the testing equipment and applied to the semiconductor memory device in the test mode (S1). Conventionally, the test CLK signal in the test mode has lower frequency than that of the operation CLK signal in the normal mode, for example, due to limitations of the testing equipment.

In the frequency multiplier 11, the first and second internal test clock signals TCLK0 and TCLK1, each of which has a frequency that is same as that of the operation CLK signal, are generated using the test CLK signal (S2). As shown in FIG. 4, the dividing ratio N of the divider 27 included in the frequency multiplier 11 is set at 2, for example. The frequency of each of the first internal test clock signal TCLK0 and the second internal test clock signal TCLK1 is therefore double the frequency of the test CLK signal.

In the test command sequence generator 12, command signals are generated which correspond to the operation timing parameters to be measured using the first and second internal test clock signals TCLK0 and TCLK1 (S3). For example, the TCMD signals which control tRAS and tRP may be generated. Then, the memory core 14 is operated by the TCMD signals, and the TPAT pattern for testing the memory core 14 is stored in the memory core 14 (S4).

The DPAT pattern is read from the memory core 14 and compared with the TPAT pattern (S5). Then, the comparison result is output from the semiconductor memory device in order to measure the operation timing parameters, for example, tRAS and tRP, based on the comparison result (S6).

For example, in the wafer level test method of the semiconductor memory device according to an embodiment of the present invention, the frequency of the test CLK signal may be 25 MHz for measuring tRAS and tRP using the testing equipment at the wafer level. The dividing ratio N of the divider 27 may be set to 2, so that the first and second internal test clock signals TCLK0 and TCLK1 are generated to have a frequency of 50 MHz. Accordingly, since the dividing ratio N of the divider 27 is appropriately set, the semiconductor memory device can be tested with a real operation CLK frequency at the wafer level.

In addition, since the delay time of the programmable variable delay 25 is controlled through programming, the timing of the first and second internal test clock signals TCLK0 and TCLK1, e.g., the time difference (Δt) between the first and second internal test clock signals TCLK0 and TCLK1, varies to accurately measure tRAS (minimum) and tRP (minimum).

As described above, the semiconductor memory device according to the present invention can be tested with an actual operation frequency at the wafer level and can measure operating timing parameters of the semiconductor memory device more accurately at the wafer level.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A semiconductor memory device having a test mode and a normal mode, the semiconductor memory device comprising:
a frequency multiplier that receives a test clock signal in the test mode and that generates first and second internal test clock signals, each having a frequency equal to a frequency of an operation clock signal in the normal mode, the test clock signal comprising a frequency lower than the frequency of the operation clock signal; and
a test command sequence generator that generates at least one command signal in response to the first and second internal test clock signals in the test mode, the at least one command signal controlling at least one operation timing parameter of the semiconductor memory device that is to be measured,
wherein an initial point of the at least one operation timing parameter is controlled in response to the first internal test clock signal and an end point of the at least one operation timing parameter is controlled in response to the second internal test clock signal.

2. The device of claim 1, further comprising:
a test pattern register that receives and stores a test pattern input to the semiconductor memory device in the test mode;
a memory core that receives and stores the test pattern from the test pattern register and that responds to the at least one command signal generated by the test command sequence generator;
a comparator that compares the test pattern with a data pattern read from the memory core; and
an output buffer that receives the comparison from the comparator and outputs the comparison from the semiconductor device.

3. The device of claim 1, wherein the frequency multiplier comprises a Phase Locked Loop (PLL).

4. The device of claim 3, wherein the frequency multiplier further comprises:
a phase frequency detector that detects phase and frequency differences of the test clock signal and a feedback clock signal;
a charge pump that receives an output signal from the phase frequency detector and outputs a charge pump signal;
a loop filter that low pass filters the charge pump signal from the charge pump;
a voltage controlled oscillator that generates a reference internal test clock signal in response to the filtered charge pump signal of the loop filter;
a programmable variable delay that delays the reference internal test clock signal and outputs a first internal test clock signal and a second internal test clock signal of the plurality of internal test clock signals; and
a divider that divides the first internal test clock signal and generates the feedback clock signal.

5. The device of claim 4, wherein a delay time of the programmable variable delay is variable according to programming of the programmable variable delay.

6. The device of claim 4, wherein the test command sequence generator comprises:
a first logic circuit that generates a first command signal of the at least one command signal, for controlling an initial point of a first corresponding operation timing parameter to be measured, in response to the first internal test clock signal; and
a second logic circuit that generates a second command signal of the at least one command signal, for controlling an initial point of a second corresponding operation timing parameter to be measured, in response to the second internal test clock signal.

7. The device of claim 1, wherein the frequency multiplier comprises a Delay Locked Loop (DLL).

8. A wafer level test method for a semiconductor memory device having a test mode and a normal mode, the method comprising:
applying a test clock signal having a frequency in the test mode lower than a frequency of an operation clock signal in the normal mode;
generating first and second internal test clock signals, each internal test clock signal having a frequency equal to the frequency of the operation clock signal;
generating command signals controlling operation timing parameters of the semiconductor memory device that are to be measured in response to the first and second internal test clock signals;
operating a memory core using the generated command signals and storing a test pattern in the memory core;

comparing a data pattern read from the memory core with the test pattern; and measuring the operation timing parameters of the semiconductor memory device based on the comparison of the data pattern read and the test pattern, wherein an initial point of an operation timing parameter is controlled in response to the first internal test clock signal and an end point of the operation timing parameter is controlled in response to the second internal test clock signal.

9. The method of claim 8, wherein the plurality of internal test clock signals is generated by a frequency multiplier comprising a Phase Locked Loop (PLL).

10. The method of claim 9, wherein generating the plurality of internal test clock signals comprises:

detecting phase and frequency differences of the test clock signal and a feedback clock signal;

outputting a charge pump signal in response to the detected phase and frequency differences;

low pass filtering the charge pump signal;

generating a reference internal test clock signal in response to the filtered signal;

delaying the reference internal test clock signal to output the plurality of internal test clock signals; and dividing a first internal test clock signal of the plurality of internal test clock signals to generate the feedback clock signal.

11. The method of claim 9, wherein generating of the command signals comprises:

responding to the first internal test clock signal in order to generate a first command signal which controls an initial point of a first operation timing parameter that is to be measured; and responding to the second internal test clock signal in order to generate a second command signal which controls an initial point of a second operation timing parameter that is to be measured.

12. The method of claim 8, wherein the plurality of internal test clock signals is generated by a frequency multiplier comprising a Delay Locked Loop (DLL).

* * * * *